United States Patent
Wang et al.

(10) Patent No.: US 8,492,674 B2
(45) Date of Patent: Jul. 23, 2013

(54) METHODS AND APPARATUS FOR EX SITU SEASONING OF ELECTRONIC DEVICE MANUFACTURING PROCESS COMPONENTS

(75) Inventors: Jiansheng Wang, Fremont, CA (US); Samantha Tan, Union City, CA (US)

(73) Assignee: Quantum Global Technologies, LLC, Dublin, PA (US)

( * ) Notice: Subject to any disclaimer, the term of this patent is extended or adjusted under 35 U.S.C. 154(b) by 1308 days.

(21) Appl. No.: 12/189,141

(22) Filed: Aug. 9, 2008

(65) Prior Publication Data
US 2009/0043416 A1 Feb. 12, 2009

Related U.S. Application Data

(60) Provisional application No. 60/955,281, filed on Aug. 10, 2007.

(51) Int. Cl.
*B23K 10/00* (2006.01)
(52) U.S. Cl.
USPC ............ 219/121.36; 219/121.59; 219/121.43; 219/121.44
(58) Field of Classification Search
CPC ..................................................... B23K 10/00
USPC ............... 219/121.36, 121.4, 121.41, 121.43, 219/121.44, 121.59; 427/569, 578; 118/723 R
See application file for complete search history.

(56) References Cited

U.S. PATENT DOCUMENTS

| | | | | |
|---|---|---|---|---|
| 5,522,932 | A | * | 6/1996 | Wong et al. .................... 118/715 |
| 5,647,953 | A | * | 7/1997 | Williams et al. ................ 134/1.1 |
| 2002/0005252 | A1 | * | 1/2002 | Masuda et al. ................. 156/345 |
| 2002/0170495 | A1 | | 11/2002 | Nakamura et al. |
| 2004/0182833 | A1 | | 9/2004 | Fink |

FOREIGN PATENT DOCUMENTS

| | | |
|---|---|---|
| JP | 62-253772 | 11/1987 |
| JP | 08-264462 A | 10/1996 |
| JP | 2002-339072 A | 11/2002 |
| WO | WO 2005/062359 A1 | 7/2005 |

OTHER PUBLICATIONS

International Search Report and Written Opinion of International Application No. PCT/US08/09495 mailed Nov. 7, 2008.
International Preliminary Report on Patentability and Written Opinion of International Application No. PCT/US2008/009495 mailed Feb. 25, 2010.

* cited by examiner

*Primary Examiner* — Mark Paschall
(74) *Attorney, Agent, or Firm* — Fox Rothschild, LLP

(57) ABSTRACT

In one aspect, a method of improving the performance of an electronic device manufacturing facility is provided, including the step of reducing the number of electronic device manufacturing component seasoning steps which are performed using production equipment, whereby the amount of electronic device manufacturing system downtime is reduced. Several other aspects are provided.

10 Claims, 5 Drawing Sheets

METHODS AND APPARATUS FOR EX SITU SEASONING OF ELECTRONIC DEVICE MANUFACTURING PROCESS COMPONENTS

The present application claims priority to U.S. Provisional Patent Application Ser. No. 60/955,281, filed Aug. 10, 2007 and entitled "METHODS AND APPARATUS FOR CONDITIONING PLASMA PROCESSING COMPONENTS", which is hereby incorporated herein by reference in its entirety for all purposes.

FIELD OF THE INVENTION

The present invention relates generally to equipment used in electronic device manufacturing and more particularly relates to methods and apparatus for conditioning electronic device manufacturing equipment components.

BACKGROUND OF THE INVENTION

The manufacture of electronic devices, including semiconductor devices, electronic displays, and solar cells, for example, may typically include many processes, which processes may be conducted on electronic device manufacturing systems. These processes may include, but are not limited to, deposition, chemical treatment, etching, polishing, ion implantation, epitaxial crystal growth, oxidation, photolithography, diffusion, metallization, and cleaning, etc.

Electronic device manufacturing systems may typically be expensive systems to purchase, put into service and maintain. A typical electronic device manufacturing facility, or fab, may have many of these systems, resulting in a capital intensive facility. While the systems are operational and producing electronic devices, however, these systems, and hence the facility, may be quite profitable. When an electronic device manufacturing system is taken out of service for maintenance (sometimes referred to herein as "down for maintenance"), the facility may lose the output of a profitable piece of capital equipment, until the system can be brought back into production service, and the facility's cost of operation may increase while its profitability may decrease. The longer the system is down, the less profitable the facility may be. The fab operator will therefore typically desire to put the system back into service as soon as possible.

Methods and apparatus for reducing the time electronic device manufacturing systems are down for maintenance, and for increasing the performance of electronic device manufacturing facilities, are desirable.

SUMMARY OF THE INVENTION

In one aspect, a method of improving the performance of an electronic device manufacturing facility is provided including the step of reducing the number of electronic device manufacturing component seasoning steps which are performed using production equipment, whereby the amount of electronic device manufacturing system downtime is reduced.

In another aspect, a method for seasoning a component of an electronic device manufacturing system is provided, including the step of seasoning the component before the component is installed into the electronic device manufacturing system.

In yet another aspect, a method for seasoning an electronic device manufacturing system component having an orifice is provided, including the steps exposing the component to a plasma; and forcing the plasma through the orifice.

In still another aspect, a system for seasoning a component of an electronic device manufacturing system is provided, including: a seasoning chamber; a gas supply connected to the seasoning chamber; a fixture adapted to support the component inside of the seasoning chamber; a vacuum pump connected to the fixture; and an upper electrode and a lower electrode adapted to create a plasma inside of the seasoning chamber; wherein the fixture is further adapted to draw the plasma through an orifice of the component.

Numerous other aspects are provided in accordance with these and other aspects of the invention. Other features and aspects of the present invention will become more fully apparent from the following detailed description, the appended claims and the accompanying drawings.

DETAILED DESCRIPTION

Figure 1:
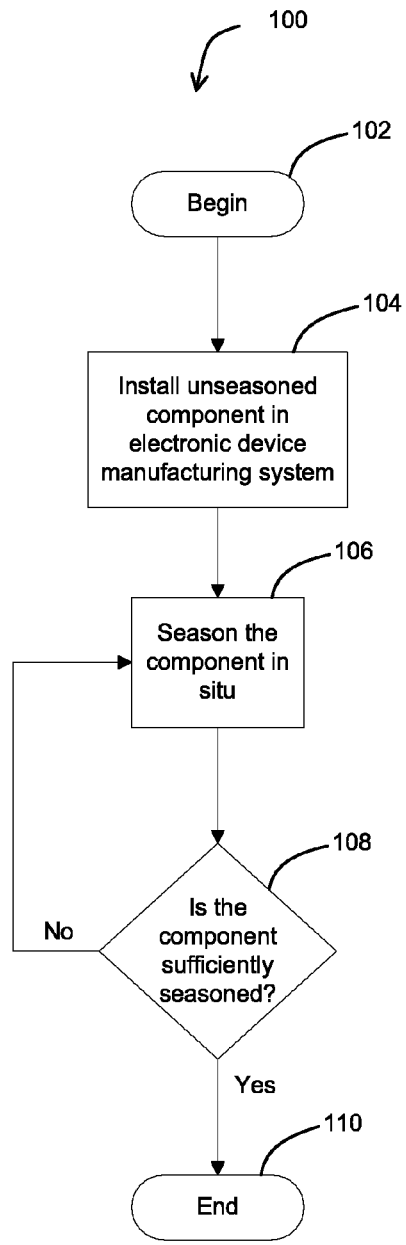
FIG. 1 is a flowchart depicting a prior art method for in situ seasoning of an electronic device manufacturing system component.

As stated above, the manufacture of electronic devices may typically include many processes, which processes may be conducted on electronic device manufacturing systems. Electronic device manufacturing systems include, but are not limited to, process chambers. Many of the components which make up these electronic device manufacturing systems may tend to wear or otherwise become undesirable or non-useful over time and require replacement and/or refurbishment. It has been found that when new or refurbished components are installed into electronic device manufacturing systems, many of the new components may require some form of seasoning or conditioning, because otherwise electronic devices which are manufactured using the systems which contain the newly installed components may not be manufactured within required specifications (e.g., the electronic devices may contain too many defects).

The following detailed description makes use of a particular example, that of ex situ seasoning of plasma process components, to illustrate a broader concept of the invention: that the performance and/or capacity of an electronic device manufacturing facility may be improved by providing the facility operator with more predictability regarding the operational status of the facility's manufacturing systems. This predictability may be provided through the relocation of selected seasoning and/or conditioning steps from the manufacturing facility and the production machinery to nonproduction machinery which may be located outside of the manufacturing facility. Thus, although the following description may focus upon removing plasma process seasoning steps from the manufacturing facility and the facility's production machinery to nonproduction seasoning equipment, the broad concept of the invention may be useful with many or all of the different processes which take place in an electronic device manufacturing facility, such as chemical mechanical polishing, chemical deposition, ion implantation, epitaxial crystal growth, oxidation, photolithography, diffusion, metallization, and cleaning, etc.

Several processes make use of a plasma during the process and are referred to herein as plasma processes. Over time, the equipment used in a plasma process may deteriorate and a component of the equipment may need to be replaced with a new or refurbished component. A problem associated with the installation of a new or refurbished component in plasma process equipment is that after the new component is installed in the equipment, the new or refurbished component may shed particles during plasma processing. If the particles land on a wafer which is being processed, the wafer may become unacceptably damaged or fall out of specification and may need to be discarded. Wafers may be very expensive articles, on the order of about $2,500 each, more or less, and it may be unacceptable to damage and discard them.

A known method to avoid the damage which may be caused by new components is to season, or condition, the installed component in a process known as "in situ" seasoning. In situ seasoning typically takes place in production process equipment. The in situ seasoning process may require exposing the new or refurbished components to a plasma in the plasma process equipment for over 100 RF hours (e.g., hours of exposure to a plasma formed with radio frequency energy). The in situ seasoning process may continue until testing determines, or experience suggests, that the process equipment which contains the new or refurbished component is capable of performing within specification. This may mean that number of particles which land on a test wafer in the plasma process equipment is within specification. (Test wafers may be used during the in situ seasoning process to avoid damaging production wafers.) Although the in situ seasoning process may operate to reduce or minimize the damage or destruction of wafers, the in situ seasoning process does have drawbacks. For example, the in situ seasoning process may be considered "down time" because no product is made during this period. Down time may be defined as time during which an electronic device manufacturing system in a fab is unable to produce product. Such down time may be undesirable because it may reduce the manufacturing output of a facility and may increase the cost of operation (COO). Methods for reducing the down time of electronic device manufacturing equipment are therefore desirable.

In one embodiment of the present invention, electronic device manufacturing system down time may be reduced by a method of seasoning (sometimes referred to as pre-seasoning) a new or refurbished component prior to installing the component into production plasma process equipment. In this embodiment the seasoning may be conducted in a nonproduction seasoning chamber. The seasoning of a component in a nonproduction seasoning chamber, or anywhere outside of a process chamber which is used to produce product in a fab, is referred to herein as "ex situ" seasoning.

One of the benefits of ex situ seasoning may be to reduce or eliminate the need for in situ seasoning of a component. The reduction or elimination of the need for in situ seasoning of the component may result in the increase of the manufacturing output of a facility and a corresponding decrease of the cost of operation of the facility. Another benefit of ex situ seasoning may be to provide predictability to the operator of a fab. Such predictability may be the knowledge that the ex situ seasoned component may be installed into an electronic device manufacturing system, and either no further seasoning, or a reduced, known number of seasoning cycles, may be required to put the electronic device manufacturing system back into production. In some cases fewer in situ seasoning steps are required based upon the ex situ seasoning performed. In the context of a plasma process, a seasoning cycle may be defined as beginning with the insertion of a test wafer into a process chamber, the exposure of the newly installed component and the test wafer to a plasma, and the removal of the test wafer from the process chamber.

Another benefit of ex situ seasoning may be that production process equipment may suffer less wear and tear because the production process equipment is not being used to in situ season components.

Yet another benefit of ex situ seasoning may be that ex situ seasoning may provide improved performance of a component when compared to the performance of an in situ seasoned component.

In another embodiment of the present invention, chamber components which have holes or orifices, and/or a front side (which faces plasma and a wafer during use in an electronic device manufacturing system), and a backside (which faces a non-plasma gas during processing), may be seasoned ex situ using a seasoning chamber and fixture which are adapted to expose the holes, and/or both the front side and the backside of the component, to a seasoning plasma during the seasoning process. During in situ seasoning of such components, the holes, and/or backsides, do not typically become seasoned as quickly as the front side of the component and may continue to shed particles for many more production wafer cycles then a component which has been seasoned ex situ according to the present invention.

FIG. 1 is a flowchart depicting a prior art method 100 for in situ seasoning of an electronic device manufacturing system component. Components used in plasma processing may be replaced due to a predetermined preventative maintenance schedule or because the performance of the component has deteriorated. Performance deterioration may be evidenced by an increased number of particles produced (particles are referred to by a variety of names including "adders" and "FM", which is short for "Foreign Material"), poor process uniformity, metal contamination on processed substrates, or even electrical arcing during plasma processing. Performance deterioration may occur in other manners. Acceptable levels of adders, uniformity, or metal contamination may vary based upon the identity of an electronic device manufacturer, the nature of a product produced and a size of a substrate produced. For example, in the case of adders, it is possible that a device manufacturer of processors using 300 mm substrates may require fewer than 10 adders of 0.15 microns or more in size. In another example, in the case of uniformity, it is possible that a device manufacturer may require a particular process to be 95% uniform (or, stated another way, less than 5% non-uniform) across a substrate. Alternatively, the non-uniformity requirement may be as rigorous as less than 2% non-uniform across a substrate.

Plasma equipment may include etch equipment such as reactive ion etcher (RIE), or sputter etchers. Plasma equipment may also include deposition equipment, such as Plasma Enhanced Chemical Vapor Deposition (PECVD), High Density Plasma enhanced chemical vapor deposition (HDP-CVD), and various embodiments of physical chemical vapor deposition (PVD) equipment including Self-Ionized Plasma physical vapor deposition (SiP-PVD). Other plasma equipment may be included. While the plasma equipment may include a varied number of components, the most commonly replaced components may include showerheads, susceptors, and various perimeter rings/shields, depending upon the equipment type.

Prior art method 100 begins in step 102. In step 104, an unseasoned component is installed in an electronic device manufacturing system. In step 106, the component is seasoned in situ.

As described above, in situ seasoning (meaning seasoning the showerhead after it has been installed in the equipment) may take over 100 RF hours. RF hours may be the number of hours the equipment or component has been exposed to radio frequency (RF) energy used when the plasma is generated and in contact with the component. When performing an in situ seasoning, a substrate, typically a test substrate, may be loaded in a processing chamber and a plasma seasoning process (appropriate for the chamber type) may be started. The process may last for 3 to 4 minutes and then the substrate may be removed and a second substrate may be inserted into the chamber. The plasma seasoning process may be repeated on the second substrate. The cycle may continue for as many as 3,000 wafer cycles or until 100 RF hours or more are accumulated. The total elapsed time may typically be greater than the number of RF hours, as the RF hours do not include the loading and unloading of substrates.

In step 108, a determination is made whether the component is sufficiently seasoned. If the determination is made that the component is not sufficiently seasoned, in situ seasoning may continue in step 106. If, in step 108, it is determined that the component is sufficiently seasoned, in situ seasoning method 100 ends in step 110. Step 108 may be omitted, and instead, a predetermined number of wafer or seasoning cycles may be performed before proceeding to step 110.

While seasoning may increase down time, it may still be desirable to season a component prior to use to reduce or prevent the shedding of particles, which may occur with newly installed components (note that the components may be either new or refurbished).

The present invention may address the problem of significant down time by providing ex situ seasoned, or pre-seasoned components, to an electronic device manufacturing fab. By shifting the seasoning of a new component from an electronic device manufacturing system in a fab to a nonproduction seasoning system in a manufacturing facility, an electronic device manufacturer may be able to install the ex situ seasoned component and start producing product without having to suffer an extended downtime.

Figure 2:
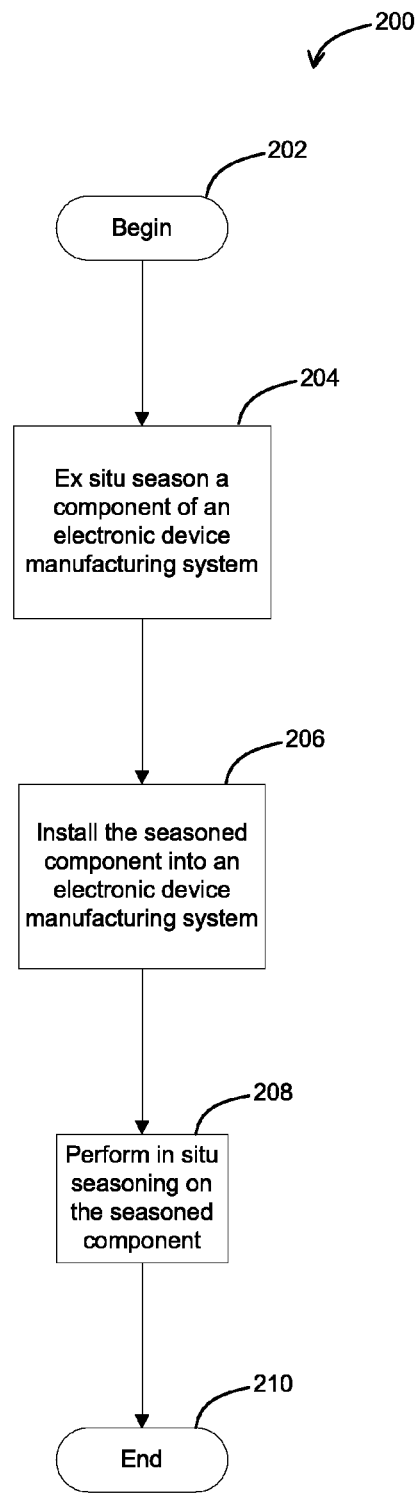
FIG. 2 is a flowchart depicting an embodiment of the invention for ex situ seasoning a component of an electronic device manufacturing system.

FIG. 2 is a flowchart depicting a method 200 for ex situ seasoning of an electronic device manufacturing system component, according to one embodiment of the invention.

Method 200 begins in step 202. In step 204, a component of an electronic device manufacturing system is seasoned ex situ. As described above, this means that the component may be seasoned in a chamber other than the process chamber in which it will later be installed for use in the production of electronic devices. For example, the component may be seasoned in a nonproduction seasoning chamber which may be located at the component manufacturer's or refurbisher's facility. Seasoning the component ex situ may be advantageous for several reasons, including that the seasoning process may reduce or eliminate any in situ seasoning that may need to be conducted in the fab, and also that an advantageous seasoning recipe which might not be usable in situ may be usable ex situ. A seasoning recipe may include a prescription of exposing a component to one or more plasmas of particular chemical composition, in one or more sequences, orders, and/or combinations for one or more time periods.

Step 204 may continue for a predetermined period of time, which has been determined empirically, until the component is sufficiently seasoned. Alternatively, in a step not shown, the component which is being seasoned in step 204 may be evaluated against selected criteria to determine whether it has been sufficiently seasoned to meet a predetermined standard. Examples of such selected criteria include, but are not limited to, micro-surface morphology/profile; surface roughness; surface particle and/or contaminant levels and substrate removal rate. The predetermined standard may be that the component may be put into service without in situ seasoning or that it may be put into service with a known, limited amount of in situ seasoning. For example, the standard may be that the component is ready to be placed into production service with no more than 20, 15, or 10 seasoning or wafer cycles. Method 200 continues in step 206 in which the ex situ seasoned component is installed into the electronic device manufacturing system. Once the component has been installed in the electronic device manufacturing system, further seasoning, e.g., in situ seasoning, may be performed in step 208. Method 200 ends in step 210.

Figure 2A:
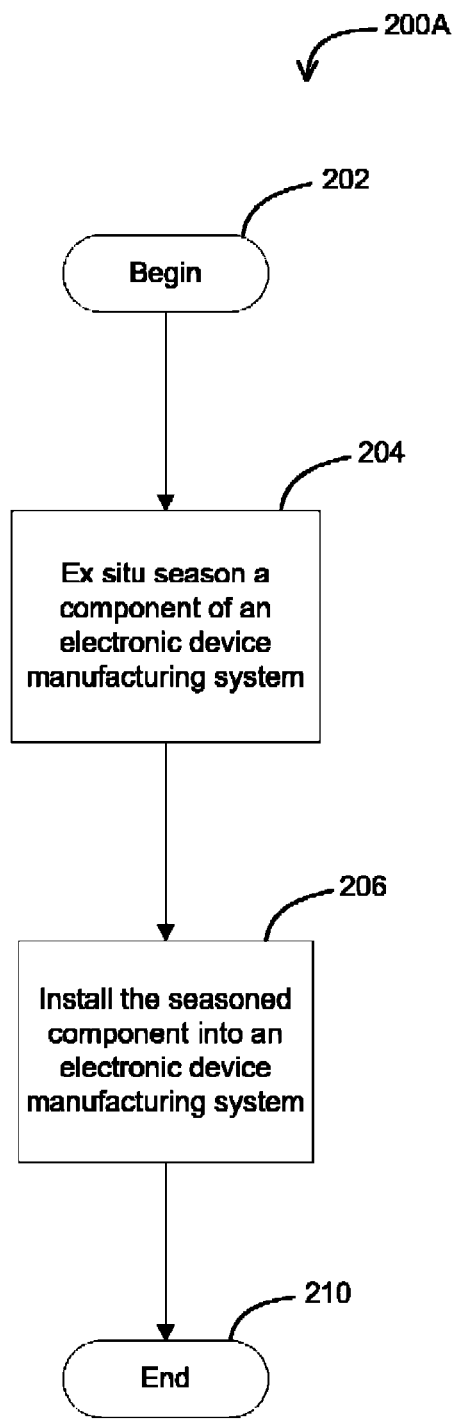
FIG. 2A is a flowchart depicting another embodiment of the invention for ex situ seasoning a component of an electronic device manufacturing system.

FIG. 2A is a flowchart depicting a method 200A for ex situ seasoning of an electronic device manufacturing system component, according to another embodiment of the invention. Method 200A may be similar to method 200 of FIG. 2, with the exception that, in method 200A, after the component has been installed in the electronic device manufacturing system, the system may be placed into service without any further seasoning of the component.

As mentioned above, another advantage of the methods of the present invention may be to provide predictability and improved performance to the operator of a fab. For example, in situ seasoning of a component may take up to 3000 or more wafer or seasoning cycles and achieve a performance level of 10 or fewer particles per wafer. Embodiments of the present invention may be used to reduce the number of seasoning cycles to less than about 20 or less than about 10 wafer or seasoning cycles, and achieve a performance level of fewer than about 1 particle per wafer. It may be very valuable in the manufacture of electronic device manufacturing system components to be able to offer such predictability and improved performance to fab operators.

Another advantage of ex situ seasoning is that seasoning configurations, methods and recipes which may not be possible in a production plasma processing chamber may be employed in a nonproduction ex situ seasoning chamber. For example, as described above, chamber components which have holes or orifices, and chamber components which have a front side and a backside, present additional technical challenges relating to seasoning. In the case of showerheads, for example, it has been found that the particle shedding matches the pattern of holes in the showerhead. Likewise, other components that may include holes, such as, for example, screws, lift pins or the like, may also exhibit particle shedding in a pattern that mirrors the hole pattern. In a production plasma processing chamber, it may take an unacceptably long time for the inner surfaces which form an orifice to become seasoned. Similarly, the rate at which the backside of a component becomes seasoned in a production plasma processing chamber may also be unacceptably slow. The present invention provides embodiments for seasoning components which contain holes, and/or front sides and backsides.

Figure 3:
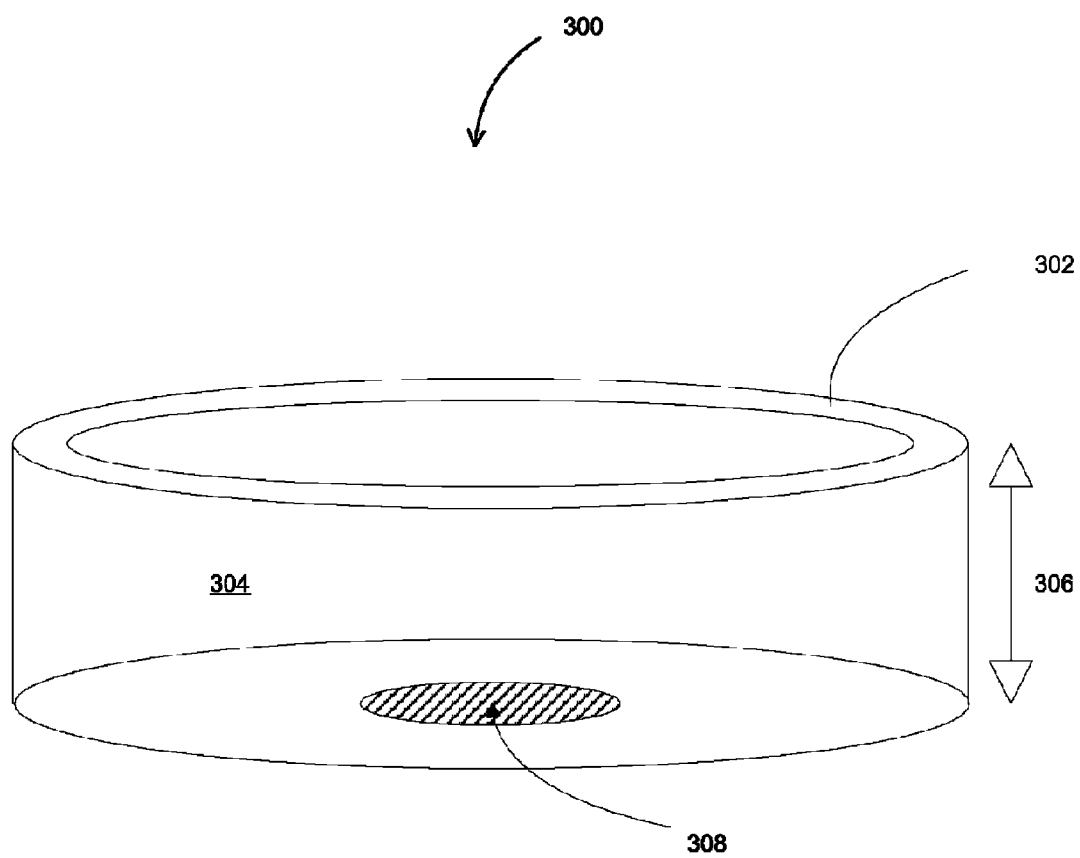
FIG. 3 is a schematic depiction of an apparatus of the invention for ex situ seasoning a component of an electronic device manufacturing system.

FIG. 3 is a schematic depiction of a fixture 300, which is one embodiment of the invention for seasoning, among other things, components which contain holes and/or front sides and backsides. Fixture 300 may be used to hold a component in an ex situ pre-seasoning system such as that described below and depicted in FIG. 4. The fixture may be made of any suitable metal, such as for example, aluminum, stainless steel, or any other plasma processing compatible material which may also be capable of acting as an electrode. The shape of the fixture may mimic or complement that of a component to be pre-seasoned. For example, if the component is a SiC plate which is round and has a diameter of about 16 inches, the fixture may be a cylinder with a similar or slightly smaller diameter than the SiC plate. The fixture may have a lip 302 upon which the component may rest. The lip 302 may be wide enough to support the component, and allow the creation of a vacuum between the component and an interior of the fixture 304. The lip 302 may not, however, cover any of orifices of the component to be seasoned to avoid interfering with the seasoning process. For large components, the fixture may include at least one strut (not shown) for further support. A height 306 of the fixture may vary from less than 1 inch to about 10 inches. The height may be optimized so as to minimize volume without compromising orifice and/or backside seasoning. The fixture may include at least one vacuum port connection 308. The figure shows the vacuum connection in the center bottom. However, this is for purposes of example only, and the location of the vacuum connection may vary, provided that all of the orifices are sufficiently seasoned. Additionally, several pumps or vacuum ports may be used, such as in the case of very large components (e.g., those used in flat panel display manufacturing) or the like.

Figure 4:
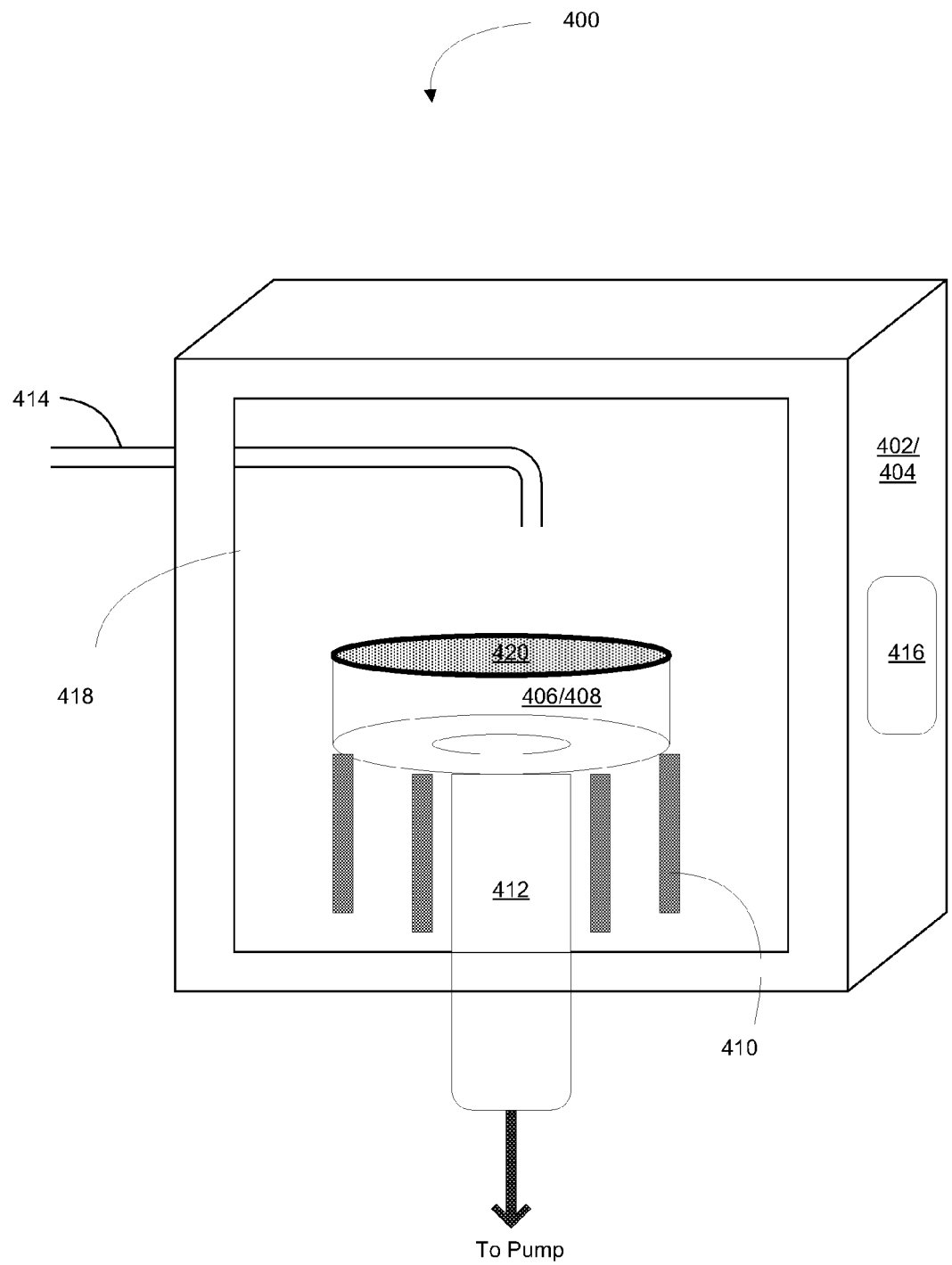
FIG. 4 is a schematic depiction of an ex situ seasoning system of the present invention.

Turning to FIG. 4, a system 400, which is an embodiment of an ex situ seasoning system of the present invention, is depicted. The system 400 may be a plasma seasoning system, including a plurality of chamber walls 402. The shape of the system in FIG. 4 is a square or rectangular box. Other shapes are possible, however, to accommodate components of varying shapes, to minimize pumping volume, or to integrate the system with other processing units. The system 400 may also include a first and a second electrode. The first electrode 404 may be formed by the walls 402 of the system and may go to ground. The second electrode 406 may be formed by the fixture 408 (which was described in more detail with reference to FIG. 3). The second electrode 406 (e.g., fixture 408) may be RF hot. Other configurations of electrodes may be used. The fixture may be supported by a plurality of legs 410. The legs 410 may be made of a ceramic or any suitable insulating material. A vacuum pump line 412 may attach the fixture to a vacuum pump (not shown) outside the chamber walls 402. The system 400 may include at least one gas feed line 414. The system 400 may have one or more windows 416 for viewing the plasma. The system 400 may also include a door 418, or other means for allowing the component to enter or exit the system, such as a lid or a slit valve. It will be recognized, though not shown, that the system may also include lift pins or other mechanisms for use with robotic handlers of components.

In operation, a component 420 may be positioned face up, e.g. front side up, on the fixture 408. A plasma may be struck, flowing one or more gases through the feed line 414, and by applying power to the fixture 408. The plasma may surround the component and the fixture and then be pulled through the orifices in the component to the vacuum pump line 412 connected to the fixture 408. Pulling the plasma through the orifices from the face-side to the backside of the component may enable the orifices and the backside of the component to be pre-seasoned. Seasoning the orifices and backside of a component may not be possible with in-situ seasoning, because in such an arrangement, the plasma and the pump may typically be on the same side of the component. Therefore, no plasma may be pulled through the orifices to the backside of a component during in situ seasoning.

The foregoing description discloses only exemplary embodiments of the invention. Modifications of the above disclosed apparatus and methods which fall within the scope of the invention will be readily apparent to those of ordinary skill in the art. In some embodiments, the apparatus and methods of the present invention may be applied to semiconductor device processing and/or electronic device manufacturing. In other embodiments, the ex situ seasoning/conditioning may be applied to processes other than plasma processes, such as chemical mechanical polishing, chemical deposition, ion implantation, epitaxial crystal growth, oxidation, photolithography, diffusion, metallization, and cleaning, etc.

Accordingly, while the present invention has been disclosed in connection with exemplary embodiments thereof, it should be understood that other embodiments may fall within the spirit and scope of the invention, as defined by the following claims.

The invention claimed is:

1. A method for seasoning a component of a process chamber for manufacturing an electronic device, the component having a face-side, a backside, and a surface defining an orifice that extends between the face-side and the backside, the method comprising:
    placing the component on a fixture in a seasoning chamber, the fixture being configured so that ends of the orifice are exposed when the component is on the fixture;
    exposing the component to a plasma;
    forcing the plasma through the orifice by creating a pressure differential across the face-side and the backside of the component;
    removing the component from the seasoning chamber after the surface that defines the orifice and the backside of the component have been coated by the plasma; and
    subsequently installing the component in the process chamber.

2. The method of claim 1 further comprising: prior to installing the component into the process chamber, determining whether the component meets a predetermined quality standard.

3. The method of claim 1 wherein the component is a new component.

4. The method of claim 1 wherein the component is a reconditioned component.

5. The method of claim 2 wherein the predetermined quality standard comprises the maximum number of in situ seasoning cycles which the ex situ seasoned component would be required to undergo before being placed into service.

6. The method of claim 1 wherein the process chamber is part of an electronic device manufacturing system selected from the group consisting of chemical mechanical polishing, chemical deposition, ion implantation, epitaxial crystal growth, plasma, oxidation, photolithography, diffusion, metallization, and cleaning systems.

7. The method of claim 1 wherein the step of forcing the plasma through the orifice comprises drawing the plasma through the orifice using a pump.

8. The method of claim 1 further comprising the fixture is adapted to form a seal with the component.

9. The method of claim 8 further comprising the step of reducing a pressure within the fixture whereby the plasma is drawn through the orifice.

10. The method of claim 9 further comprising the step of connecting a vacuum pump to the fixture.

* * * * *